United States Patent
Zhang et al.

(10) Patent No.: US 9,431,308 B2
(45) Date of Patent: Aug. 30, 2016

(54) CRITICAL SIZE COMPENSATING METHOD OF DEEP GROOVE ETCHING PROCESS

(71) Applicant: CSMC TECHNOLOGIES FAB1 CO., LTD., Wuxi New District (CN)

(72) Inventors: Anna Zhang, Wuxi New District (CN); Xiaoming Li, Wuxi New District (CN)

(73) Assignee: CSMC TECHNOLOGIES FAB1 CO., LTD., Wuxi New District, Jiangsu (CN)

( * ) Notice: Subject to any disclaimer, the term of this patent is extended or adjusted under 35 U.S.C. 154(b) by 27 days.

(21) Appl. No.: 14/436,033

(22) PCT Filed: Dec. 31, 2013

(86) PCT No.: PCT/CN2013/091145
§ 371 (c)(1),
(2) Date: Apr. 15, 2015

(87) PCT Pub. No.: WO2014/108036
PCT Pub. Date: Jul. 17, 2014

(65) Prior Publication Data
US 2015/0279749 A1  Oct. 1, 2015

(30) Foreign Application Priority Data
Jan. 10, 2013  (CN) .......................... 2013 1 0008959

(51) Int. Cl.
H01L 21/66 (2006.01)
H01L 21/308 (2006.01)
H01L 21/3065 (2006.01)

(52) U.S. Cl.
CPC ............ *H01L 22/12* (2013.01); *H01L 21/308* (2013.01); *H01L 21/3065* (2013.01); *H01L 21/3083* (2013.01); *H01L 22/20* (2013.01)

(58) Field of Classification Search
CPC . H01L 22/12; H01L 21/308; H01L 21/3065; H01L 21/3083; H01L 22/20; H01L 21/66
USPC .......................................................... 438/14
See application file for complete search history.

(56) References Cited

U.S. PATENT DOCUMENTS

| | | | |
|---|---|---|---|
| 2005/0250021 A1* | 11/2005 | Chen .......................... | G03F 1/36 430/5 |
| 2005/0264790 A1* | 12/2005 | Janssen .................... | G03F 1/144 355/69 |
| 2008/0076077 A1 | 3/2008 | Nakagawa | |

FOREIGN PATENT DOCUMENTS

| CN | 1641834 | 7/2005 |
|---|---|---|
| CN | 101673050 | 3/2010 |
| CN | 103065943 | 4/2013 |

*Primary Examiner* — Selim Ahmed
(74) *Attorney, Agent, or Firm* — Hamre, Schumann, Mueller & Larson, P.C.

(57) ABSTRACT

A critical dimension compensating method of a deep trench etching process includes: obtaining an etching critical dimension difference; compensating an masking layer layout for wafer etching according to a distance between an etching position and the center position of the wafer, and the etching critical dimension difference; and performing a deep trench etching to the wafer according to the compensated masking layer layout. The dimension of the etching patterns of the masking layer layout is compensated by using half of the critical dimension difference as the compensation value, such that the etch rate difference and the etching dimension difference caused by uneven distribution of the critical dimension at different wafer locations during the deep trench etching process are improved, thus greatly improving the uniformity of the critical dimension of the deep trench etching structure.

9 Claims, 2 Drawing Sheets

CRITICAL SIZE COMPENSATING METHOD OF DEEP GROOVE ETCHING PROCESS

FIELD OF THE INVENTION

The present disclosure relates to semiconductor manufacturing technologies, and more particularly relates to a critical dimension compensating method of a deep trench etching process.

BACKGROUND OF THE INVENTION

Deep trench etching (DSIE) technology has been widely used in manufacturing of semiconductors, such as Micro-Electro-Mechanical Systems (MEMS) and power MOSFET (Power MOS). In a conventional deep trench etching process, photoresist is used as a masking layer, which is then patterned according to designed pattern layout using a photolithography process. After that, a part to be etched is exposed by the etching pattern on the patterned photoresist. During the deep trench etching process, an etching deepness is usually greater than 300 μm, while the etching critical dimension (CD), i.e., the width of the etched trench or the diameter of the etched hole, is usually greater than 500 μm. Due to the long time and high deepness of deep trench etching process, the masking layer may be damaged and morphology changes to which may occur due to ion etching during the etching process, such that the critical dimension for the etching gradually increases along with the time. In addition, during the deep trench etching process, the damage levels to the masking layer at a center position and at an edge position of the wafer are different using the conventional etching equipment, which further increases the difference between the etching structures at the center position and at an edge position of the wafer. Generally speaking, a critical dimension of an etching structure at the edge of the wafer is greater than that at the center of the wafer, and this etching critical dimension difference for different positions may cause adverse effects to the product performance.

SUMMARY OF THE INVENTION

Accordingly, it is necessary to provide a critical dimension compensating method of a deep trench etching process, which can improve the uniformity of the critical dimension of the deep trench etching process.

A critical dimension compensating method of a deep trench etching process includes:

obtaining an etching critical dimension difference between a center position of a wafer and an edge position of the wafer after a deep trench etching process;

compensating an masking layer layout for wafer etching according to a distance between an etching position and the center position of the wafer, and the etching critical dimension difference, such that dimensions of etching patterns exposed by the masking layer layout being gradually decreased along a radial direction of the wafer from center to edge; and a difference between a dimension of an etching pattern exposed by the masking layer layout at the edge of the wafer and a dimension of an etching pattern exposed by the masking layer layout at the center of the wafer equaling to half of the etching critical dimension difference; and performing a deep trench etching to the wafer according to the compensated masking layer layout.

Preferably, the dimensions of etching patterns exposed by the masking layer layout are calculated according to the following formula:

$$CD_{Ni} = CD - \frac{N-i}{2N}\Delta CD$$

wherein N represents a total number of the etching patterns along a radial direction of the wafer from center to edge; $CD_{Ni}$ represents a critical dimension of the i-th etching pattern from the center position of the wafer to the edge position of the wafer, CD represents an original critical dimension of the etching pattern, $\Delta CD$ represents the etching critical dimension difference.

In one embodiment, the obtaining the etching critical dimension difference between the center position of the wafer and the edge position of the wafer after the deep trench etching process includes:

obtaining the etching critical dimension difference by measuring a critical dimension of an experimental wafer after performing a deep trench etching process to the experimental wafer using an original masking layer layout.

In one embodiment, the performing a deep trench etching to the wafer according to the compensated masking layer layout includes:

adjusting a total etching amount of the deep trench etching process based on an original deep trench etching process parameter, such that a corresponding etching protection amount being reduced.

In one embodiment, the adjusted total etching amount is obtained by verifying repeated experiments on wafers etched by the compensated masking layer layout.

Another critical dimension compensating method of a deep trench etching process includes:

obtaining etching critical dimension differences between a center position of a wafer and each etching pattern position of the wafer after a deep trench etching process;

compensating an masking layer layout for wafer etching according to half of the etching critical dimension difference corresponding to each etching pattern position, such that a difference between a dimension of each etching pattern and a dimension of an etching pattern exposed by the masking layer layout at the center of the wafer equaling to half of the etching critical dimension difference; and performing a deep trench etching to the wafer according to the compensated masking layer layout.

In one embodiment, the obtaining the etching critical dimension difference between the center position of the wafer and the edge position of the wafer after the deep trench etching process includes:

obtaining the etching critical dimension difference by measuring a critical dimension of an experimental wafer after performing a deep trench etching process to the experimental wafer using an original masking layer layout.

In one embodiment, the performing a deep trench etching to the wafer according to the compensated masking layer layout includes:

adjusting a total etching amount of the deep trench etching process based on an original deep trench etching process parameter, such that a corresponding etching protection amount being reduced.

In one embodiment, the adjusted total etching amount is obtained by verifying repeated experiments on wafers etched by the compensated masking layer layout.

In the forgoing method, the dimension of the etching patterns of the masking layer layout is compensated by using half of the critical dimension difference as the compensation value, such that the etch rate difference and the etching dimension difference caused by uneven distribution of the critical dimension at different wafer locations during the deep trench etching process are improved, thus greatly improving the uniformity of the critical dimension of the deep trench etching structure.

BRIEF DESCRIPTION OF THE DRAWINGS

These and other features of the present invention will become readily apparent upon further review of the following specification and drawings.

DETAILED DESCRIPTION OF THE EMBODIMENTS

Figure 1:
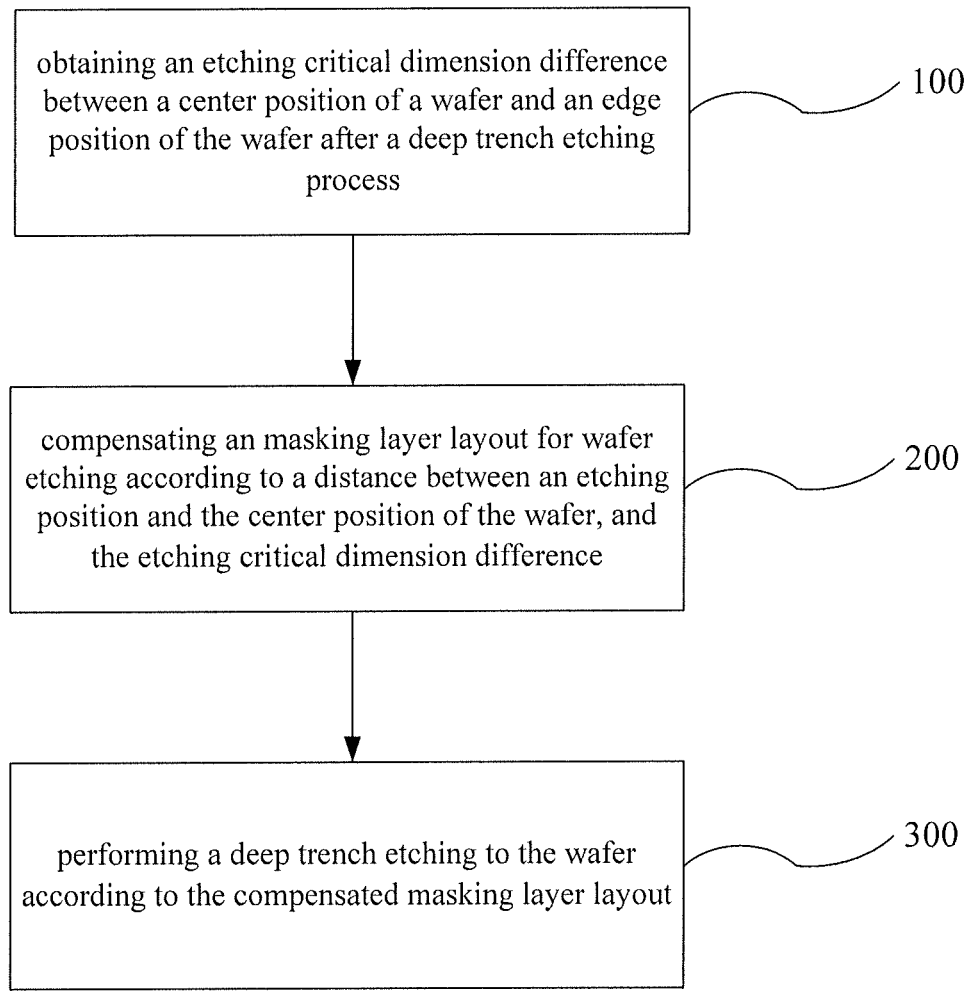
FIG. 1 is a flowchart of a critical dimension compensating method of a deep trench etching process according to a first embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

FIG. 1 is a flowchart of a critical dimension compensating method of a deep trench etching process according to a first embodiment. Referring to FIG. 1, the method includes the following steps:

Step 100, an etching critical dimension difference between a center position of a wafer and an edge position of the wafer after a deep trench etching process is obtained.

In one embodiment, after a deep trench etching process is performed to an experimental wafer using an original masking layer layout, the critical dimension of the experimental wafer is measured, and the etching critical dimension difference is obtained by verifying the critical dimension repeatedly and adjusting a process parameter. Then the masking layer layout is further compensated using the parameter obtained from the experiments.

Step 200, an masking layer layout for wafer etching is compensated according to a distance between an etching position and the center position of the wafer, and the etching critical dimension difference, such that dimensions of etching patterns exposed by the masking layer layout is gradually decreased along a radial direction of the wafer from center to edge; and a difference between a dimension of an etching pattern exposed by the masking layer layout at the edge of the wafer and a dimension of an etching pattern exposed by the masking layer layout at the center of the wafer equals to half of the etching critical dimension difference.

The dimensions of the etching patterns are adjusted at a masking layer layout design stage, such that a dimension of an etching patterns exposed by the masking layer at the edge of the wafer is smaller than a dimension of an etching patterns exposed by the masking layer at the center of the wafer, i.e., the masking layer has a greater masking area at the edge thereof. Accordingly, the morphology of the masking layer at the edge can be compensated to decrease an etch rate at the edge, such that the consistency of critical dimensions at the edge of the wafer and the center of the wafer can be maintained when the etching is completed.

In addition, since the critical dimension differences of the deep trench etching is gradually changed from the center of the wafer to the edge of the wafer, the gradually changed etching pattern dimension can compensate the gradually changed differences, such that the consistency of the critical dimensions of all the etching patterns on the whole wafer can be increased.

In a preferable embodiment, the dimensions of etching patterns exposed by the masking layer layout (i.e. a diameter of an etching hole) are calculated according to the following formula:

$$CD_{Ni} = CD - \frac{N-i}{2N} \Delta CD$$

where N represents a total number of the etching patterns along a radial direction of the wafer from center to edge; $CD_{Ni}$ represents a critical dimension of the i-th etching pattern from the center position of the wafer to the edge position of the wafer, CD represents an original critical dimension of the etching pattern, $\Delta CD$ represents the etching critical dimension difference.

In the present embodiment, the dimensions of N etching patterns arranged along a radial direction of the wafer from center to edge is actually gradually decreased using ½N of the etching critical dimension difference between the center of the wafer and the edge of the wafer obtained in step 100 as a step size. Accordingly, a compensation value of the etching pattern at the center of the wafer is zero, and a compensating value of the etching pattern at the edge of the wafer equals to $\Delta CD/2$. In other words, a dimension of the etching pattern exposed by the masking layer layout at the center of the wafer is greater than a dimension of the etching pattern exposed at the edge of the wafer by half times of the etching critical dimension difference.

Step 300, a deep trench etching is performed to the wafer according to the compensated masking layer layout.

In one embodiment, the step of performing the deep trench etching to the wafer according to the compensated masking layer layout includes:

A total etching amount of the deep trench etching process is adjusted based on an original deep trench etching process parameter, such that a corresponding etching protection amount is reduced.

The adjusted total etching amount is obtained by verifying repeated experiments on wafers etched by the compensated masking layer layout.

In the present embodiment, the dimension of the etching patterns of the masking layer layout is gradually compensated by using half of the critical dimension difference as the compensation value, such that the etch rate difference and the etching dimension difference caused by uneven distribution of the critical dimension at different wafer locations during the deep trench etching process are improved, thus greatly improving the uniformity of the critical dimension of the deep trench etching structure.

Figure 2:
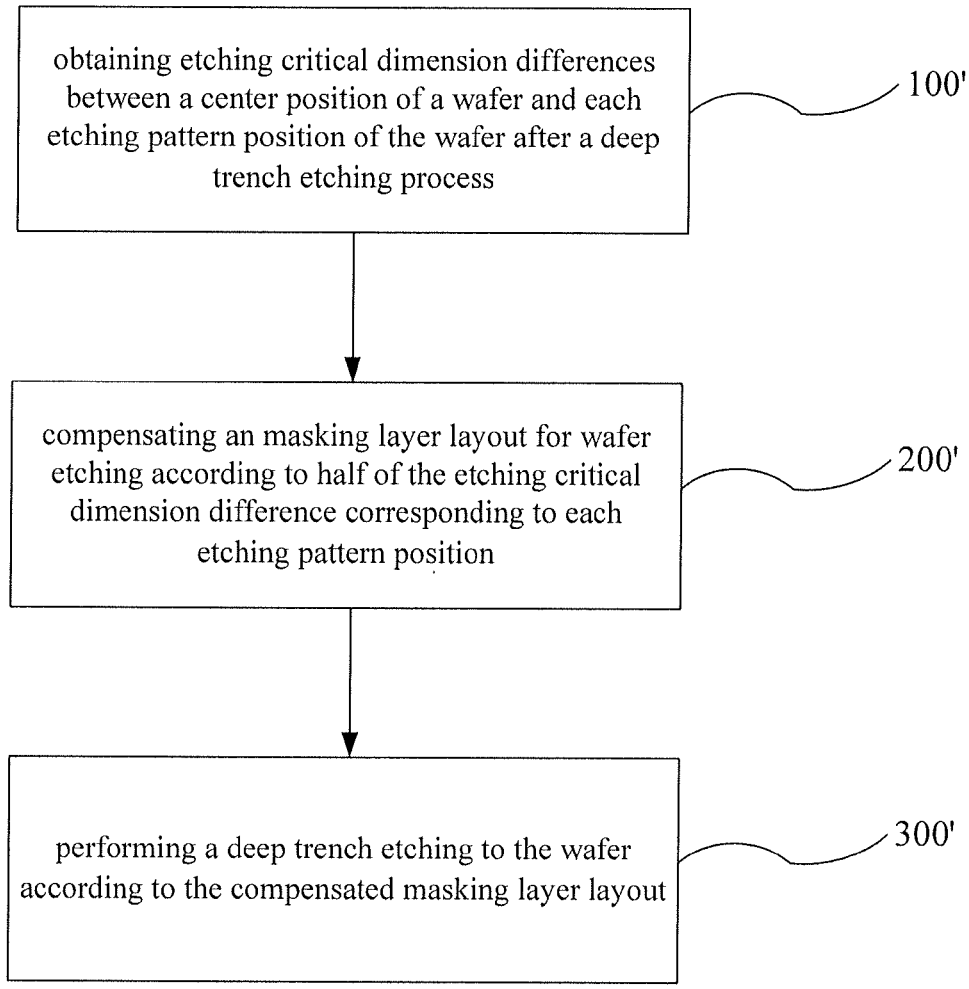
FIG. 2 is a flowchart of a critical dimension compensating method of a deep trench etching process according to a second embodiment.

FIG. 2 is a flowchart of a critical dimension compensating method of a deep trench etching process according to a second embodiment. Referring to FIG. 2, the method includes the following steps:

Step 100', etching critical dimension differences between a center position of a wafer and each etching pattern position of the wafer after a deep trench etching process are obtained.

As different from that of the first embodiment, in order to compensate the layout more accurately, critical dimensions of each etching pattern position of the wafer are measured in the second embodiment. Therefore, rather than obtaining one critical dimension difference between the center position of the wafer and the edge position of the wafer, a plurality of critical dimension differences corresponding to each etching pattern of the wafer are obtained.

Step 200', an masking layer layout for wafer etching is compensated according to half of the etching critical dimension difference corresponding to each etching pattern position, such that a difference between a dimension of each etching pattern and a dimension of an etching pattern exposed by the masking layer layout at the center of the wafer equals to half of the etching critical dimension difference.

The dimensions of the etching patterns are adjusted at a masking layer layout design stage, such that a dimension of an etching patterns exposed by the masking layer at the edge of the wafer is smaller than a dimension of an etching patterns exposed by the masking layer at the center of the wafer, i.e., a masking area of the masking layer at the edge is greater. Accordingly, the morphology of the masking layer at the edge can be compensated to decrease an etch rate at the edge, such that the consistency of critical dimensions at the edge of the wafer and the center of the wafer can be maintained after the etching is completed.

In the illustrated embodiment, since the critical dimensions difference of each etching pattern position on the wafer are obtained, the etching pattern of the masking layer layout can be compensated with half times of the critical dimension difference corresponding to the etching pattern of the position.

Step 300', a deep trench etching is performed to the wafer according to the compensated masking layer layout.

In one embodiment, the step of performing the deep trench etching to the wafer according to the compensated masking layer layout includes:

A total etching amount of the deep trench etching process is adjusted based on an original deep trench etching process parameter, such that a corresponding etching protection amount is reduced.

The adjusted total etching amount is obtained by verifying repeated experiments on wafers etched by the compensated masking layer layout.

In the present embodiment, a plurality of critical dimension differences of each etching positions and center positions of the wafer are obtained, the etching pattern of the masking layer layout can be compensated with half times of the corresponding critical dimension difference at each corresponding positions, thus the compensation accuracy is improved, and the uniformity of the critical dimension of the deep trench etching structure is optimized.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A critical dimension compensating method of a deep trench etching process, comprising:
    obtaining an etching critical dimension difference between a center position of a wafer and an edge position of the wafer after a deep trench etching process;
    compensating a masking layer layout for wafer etching according to a distance between an etching position and the center position of the wafer, and the etching critical dimension difference, such that dimensions of etching patterns exposed by the masking layer layout being gradually decreased along a radial direction of the wafer from center to edge; and a difference between a dimension of an etching pattern exposed by the masking layer layout at the edge of the wafer and a dimension of an etching pattern exposed by the masking layer layout at the center of the wafer equaling to half of the etching critical dimension difference; and
    performing a deep trench etching to the wafer according to the compensated masking layer layout.

2. The method according to claim 1, wherein the dimensions of etching patterns exposed by the masking layer layout are calculated according to the following formula:

$$CD_{Ni} = CD - \frac{N-i}{2N} \Delta CD$$

wherein N represents a total number of the etching patterns along a radial direction of the wafer from center to edge; $CD_{Ni}$ represents a critical dimension of the i-th etching pattern from the center position of the wafer to the edge position of the wafer, CD represents an original critical dimension of the etching pattern, $\Delta CD$ represents the etching critical dimension difference.

3. The method according to claim 1, wherein the obtaining the etching critical dimension difference between the center position of the wafer and the edge position of the wafer after the deep trench etching process comprises:
    obtaining the etching critical dimension difference by measuring a critical dimension of an experimental wafer after performing a deep trench etching process to the experimental wafer using an original masking layer layout.

4. The method according to claim 1, wherein the performing a deep trench etching to the wafer according to the compensated masking layer layout comprises:
    adjusting a total etching amount of the deep trench etching process based on an original deep trench etching process parameter, such that a corresponding etching protection amount being reduced.

5. The method according to claim 4, wherein the adjusted total etching amount is obtained by verifying repeated experiments on wafers etched by the compensated masking layer layout.

6. A critical dimension compensating method of a deep trench etching process, comprising:
    obtaining etching critical dimension differences between a center position of a wafer and each etching pattern position of the wafer after a deep trench etching process;
    compensating a masking layer layout for wafer etching according to half of the etching critical dimension difference corresponding to each etching pattern position, such that a difference between a dimension of each etching pattern and a dimension of an etching pattern exposed by the masking layer layout at the center of the wafer equaling to half of the etching critical dimension difference; and
    performing a deep trench etching to the wafer according to the compensated masking layer layout.

7. The method according to claim 6, wherein the obtaining the etching critical dimension difference between the center position of the wafer and the edge position of the wafer after the deep trench etching process comprises:
   obtaining the etching critical dimension difference by measuring a critical dimension of an experimental wafer after performing a deep trench etching process to the experimental wafer using an original masking layer layout.

8. The method according to claim 6, wherein the performing a deep trench etching to the wafer according to the compensated masking layer layout comprises:
   adjusting a total etching amount of the deep trench etching process based on an original deep trench etching process parameter, such that a corresponding etching protection amount being reduced.

9. The method according to claim 8, wherein the adjusted total etching amount is obtained by verifying repeated experiments on wafers etched by the compensated masking layer layout.

* * * * *